US007326139B2

(12) United States Patent
Eichhorn et al.

(10) Patent No.: US 7,326,139 B2
(45) Date of Patent: Feb. 5, 2008

(54) BELT WITH INTEGRATED MONITORING

(75) Inventors: Roland Eichhorn, Oberkulm (CH); Claudio De Angelis, Münster (DE); Karl Weinberger, Cham (CH)

(73) Assignee: Inventio AG, Hergiswil NW (CH)

( * ) Notice: Subject to any disclaimer, the term of this patent is extended or adjusted under 35 U.S.C. 154(b) by 0 days.

(21) Appl. No.: 11/106,759

(22) Filed: Apr. 15, 2005

(65) Prior Publication Data

US 2005/0245338 A1 Nov. 3, 2005

(51) Int. Cl.
*F16G 1/04* (2006.01)
*G01R 31/00* (2006.01)
*H05B 6/50* (2006.01)

(52) U.S. Cl. ...................... 474/260; 474/237; 219/650; 324/522

(58) Field of Classification Search ................ 474/260, 474/268, 152–153, 237, 266; 324/522, 543; 187/252–254, 411, 266, 393; 340/584, 668; 361/103, 106; 219/635, 653, 650

See application file for complete search history.

(56) References Cited

U.S. PATENT DOCUMENTS

| | | | | |
|---|---|---|---|---|
| 5,834,942 | A * | 11/1998 | De Angelis | 324/522 |
| 6,318,504 | B1 * | 11/2001 | De Angelis | 187/254 |
| 6,392,551 | B2 * | 5/2002 | De Angelis | 340/584 |
| 6,397,974 | B1 * | 6/2002 | Adifon et al. | 187/254 |
| 2001/0040039 | A1 | 11/2001 | De Angelis | |
| 2003/0062225 | A1 * | 4/2003 | Stucky et al. | 187/393 |
| 2003/0062226 | A1 * | 4/2003 | Stucky et al. | 187/393 |
| 2004/0118833 | A1 * | 6/2004 | Rohrauer et al. | 219/635 |

FOREIGN PATENT DOCUMENTS

| | | | | |
|---|---|---|---|---|
| DE | 39 34 654 | | 5/1991 | |
| EP | 0 731 209 | | 9/1996 | |
| GB | 2152088 | A * | 7/1985 | |
| JP | 62-90348 | A * | 4/1987 | |
| JP | 63-307610 | A * | 12/1988 | 174/128.1 |
| WO | WO 00/58706 | A2 * | 10/2000 | |

* cited by examiner

*Primary Examiner*—Marcus Charles
(74) *Attorney, Agent, or Firm*—Fraser Clemens; Martin & Miller LLC; William J. Clemens

(57) ABSTRACT

A belt has at least two fiber strands which have synthetic fiber threads twisted in themselves and are designed for acceptance of force in longitudinal direction. The strands are arranged at a spacing relative to one another along the longitudinal direction of the belt and are embedded in a belt casing. At least one of the strands comprises an electrically conductive indicator thread which is twisted together with the synthetic fiber threads of the strand, wherein the indicator thread is arranged outside the center of the fiber bundle. The indicator thread has a breaking elongation ($\epsilon_{ult,Ind}$) which is smaller than the breaking elongation ($\epsilon_{ult,Trag}$) of individual synthetic fiber threads of the strand. It can be electrically contacted so that an electrical monitoring of the integrity thereof is made possible.

20 Claims, 4 Drawing Sheets

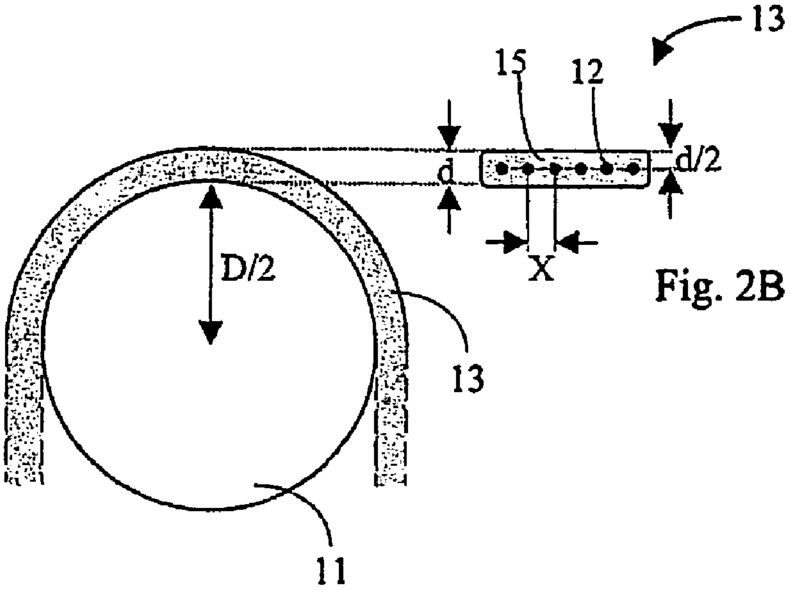
Fig. 2B
Fig. 2A
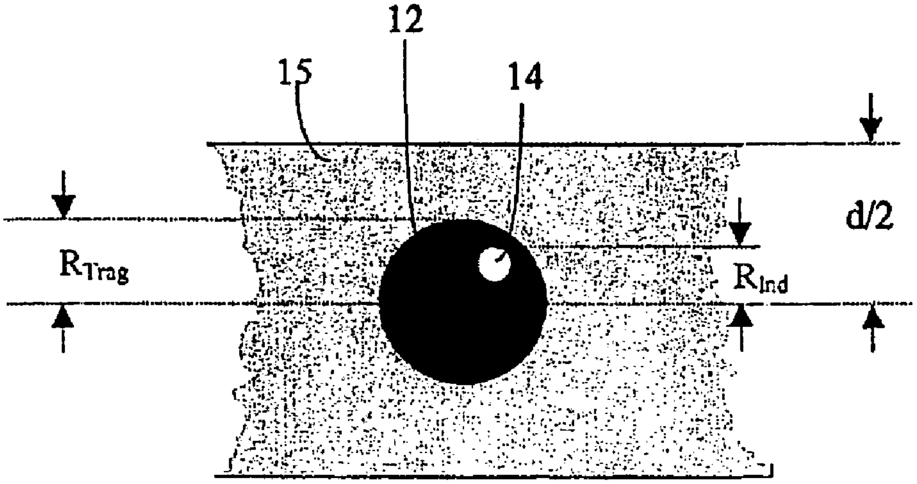
Fig. 2C

BELT WITH INTEGRATED MONITORING

BACKGROUND OF THE INVENTION

The present invention relates to a belt with several synthetic fiber strands which extend at a spacing and which are embedded in a belt casing. Belts of that kind are particularly suitable for use as support means or drive means in an elevator installation.

Running cables are an important, strongly loaded mechanical element in conveying technology, particularly in elevators, in crane construction and in mining. The loading of driven cables as used in, for example, elevator construction is particularly multi-layered.

In the case of conventional elevator installations the car frame of a car guided in an elevator shaft and a counterweight are connected together by way of several steel stranded cables. In order to raise and lower the car and the counterweight, the cables run over a drive pulley that is driven by a drive motor. The drive moment is imposed under friction couple on the respective cable portion contacting the drive pulley over the looping angle. In that case the cables experience tension, bending, compression and torsion stresses. Depending on the situation the stresses arising have a negative influence on the cable state. Due to the usually round cross-section of a steel stranded cable the cable can twist when running around pulleys and is thereby loaded in bending in the most diverse directions.

Apart from demands on strength, in the case of elevator installations there also exists for reasons of energy the requirement for smallest possible masses. High-strength synthetic fiber cables, for example of aromatic polyamides, particularly aramides, with intensely oriented molecular chains fulfil these requirements better than steel cables.

Cables made of aramide fibers have by comparison to conventional steel cables only a quarter to a fifth of the specific cable weight for the same cross-section and same load-carrying capability. By contrast to steel, however, aramide fiber has, due to the alignment of the molecular chains, a substantially lower transverse strength in relation to the longitudinal load-carrying capability.

In addition, these cables made of aramide fibers are subjected to twisting phenomena and bending loads which can lead to fatiguing or breakage of the cable.

Apart from the most diverse cables there are also belts which are used industrially. Belts are principally used by the automobile industry, for example as V-belts, or by the machine industry. Depending on the degree of loading, belts of that kind are steel-reinforced. In that case they are usually endless belts. Monitoring of an endless belt is relatively costly and for reasons of cost does not come into use in the automobile sector. The automobile industry has therefore followed the path of providing the belts that are used with a service life limitation in order to ensure that a belt is exchanged before it runs the risk of failure. Such a service life limitation is suitable only in the case of large batch numbers, since the necessary investigations can be made here, and in the case of belts which are simple to replace.

Elevator installations, in which cogged belts are used, are already described such as in, for example, the patent application with the title "Elevator with belt-like transmission means, particularly with a V-ribbed belt, as support means and/or drive means" of the same applicant as the present invention. A cogged belt is a mechanically positive, slip-free transmission means which, for example, circulates synchronously with a drive pulley. The load-carrying capability of the teeth of the cogged belt and the number of teeth disposed in engagement determines the load transfer capability.

In order to create a belt which is usable as an entirely adequate and above all reliable/support means or drive means it may have to be ensured that fatigue phenomena of the belt and, above all, incipient risk of breakage are recognizable.

A service life restriction, such as, for example, prescribed by the automobile industry, will be less suitable in the case of a belt which is to be used as a support belt or drive means for an elevator.

Other monitoring means which have proved satisfactory in the case of steel cables, such as optical monitoring, cannot be used in the case of belts since the strands of the belt are embedded in a belt casing and thus invisible. Further monitoring methods such as X-ray monitoring or ultrasound monitoring are uneconomic when a belt is used in the elevator system.

SUMMARY OF THE INVENTION

The present invention pursues the object of providing a belt, the state of which can be monitored. In particular, it is an object of the invention to provide a belt which has monitoring means and which is usable as support means or drive means inter alia for elevator installations.

The present invention concerns a belt with at least two strands which comprise synthetic fiber threads twisted in themselves and which are designed for acceptance of force in a longitudinal direction, wherein the strands are arranged parallel to one another along a longitudinal direction of the belt and at a spacing from one another and are embedded in a belt casing. At least one of the strands includes an electrically conductive indicator thread which is twisted together with the synthetic fiber threads of the at least one strand. The indicator thread has a breaking elongation ($\epsilon_{ult, Ind}$) which is smaller than a breaking elongation ($\epsilon_{ult,Trag}$) of individual ones of the synthetic fiber threads of the strand and is adapted to be electrically contacted so as to enable an electrical monitoring of the integrity of the indicator thread.

DESCRIPTION OF THE DRAWINGS

The above, as well as other advantages of the present invention, will become readily apparent to those skilled in the art from the following detailed description of a preferred embodiment when considered in the light of the accompanying drawings in which:

FIG. 2A is a side elevation view of a drive pulley with a section of a support belt according to the present invention;

FIG. 2B is a cross-sectional view of the support belt shown in FIG. 2A;

FIG. 2C is an enlarged detail of the support belt shown in FIG. 2B;

DESCRIPTION OF THE PREFERRED EMBODIMENT

Figure 1:
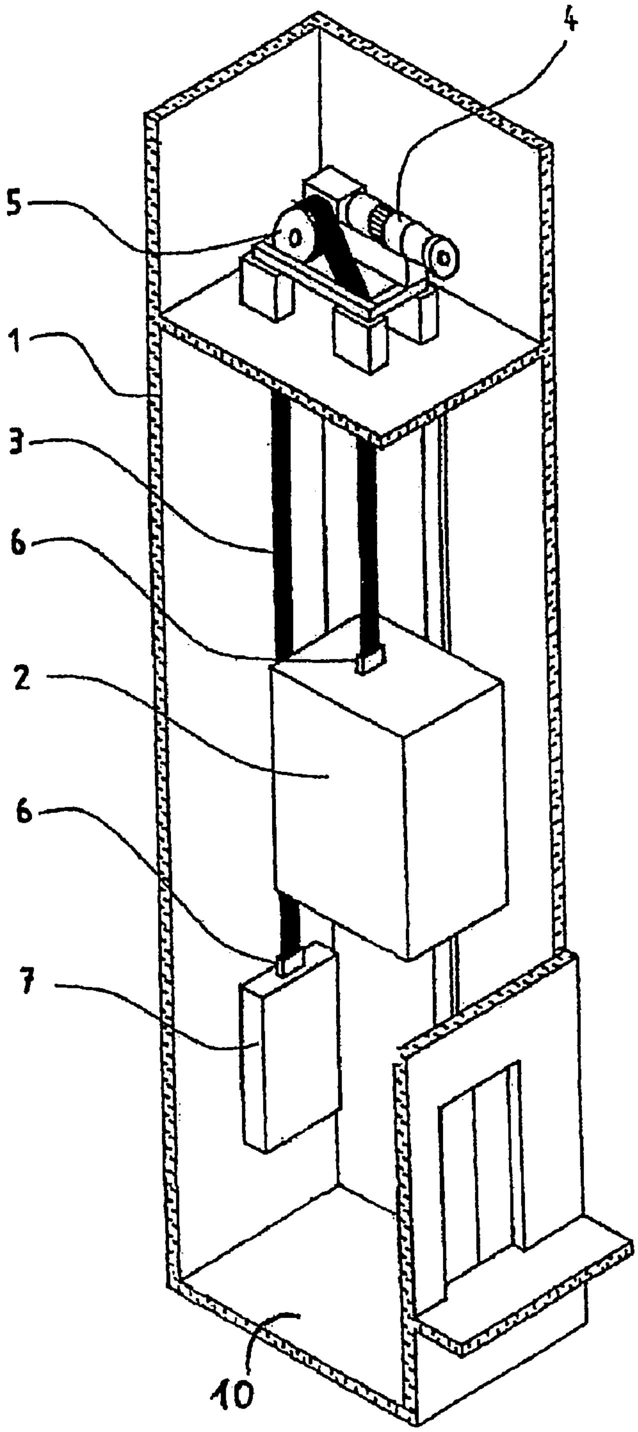
FIG. 1 is a schematic view of an elevator installation with a car connected with a counterweight by way of a support belt according to the present invention.

Like constructional elements or constructional elements acting in like manner are provided in all figures with the same reference numerals even if they are not realized in the same manner with respect to details. The figures are not true to scale.

According to FIG. 1 a car 2 guided in a shaft 1 is suspended at a supporting belt 3 (support belt) according to the present invention, which preferably comprises a fiber bundle of aramide fibers and which runs over a drive pulley 5 connected with the drive motor 4. A belt end connection 6, at which the support belt 3 is fastened by one end, is disposed on the car 2. The respective other end of the support belt 3 is fixed in like manner to a counterweight 7, which is similarly guided in the shaft 1. The illustrated arrangement is a so-termed 1:1 suspension which is distinguished by the fact that the support belt 3 according to the present invention is curved in only one direction, since it runs around only a single drive pulley 5 without having to be deflected over other pulleys, as would be the case with, for example, a 2:1 suspension.

The relatively low weight of support belts with synthetic material strands offers the advantage that in the case of elevator installations it is possible to partly or entirely dispense with the usual compensating belts.

In certain circumstances, however, a compensating belt can also be provided notwithstanding the use of belts with light synthetic material strands. Such a compensating belt is then connected in similar manner by its first end with the lower end of the car 2, from where the compensating belt leads to the counterweight 7 by way of, for example, deflecting rollers (not shown) located at the shaft floor 10.

In order to increase the safety of systems in which belts are used a monitoring system is to be provided. Investigations have shown that monitoring of the belt casing does not deliver reliable results. Breakages or fatigues of the strands, which can give the belt the longitudinal strength, possibly remain unnoticed in the case of monitoring of the belt casing alone and can lead to a sudden failure of a belt.

A direct monitoring of the strands therefore appears to be more appropriate. However, it is problematic with such a direct monitoring that the bending elongations, which arise in the belt during running around the drive pulley, are relatively small. The latter is due to the fact that with respect to typical applications in elevator installations a relatively small value is usually selected for the belt thickness compared with, for example, the thickness of a corresponding support cable, which is suitable for the same application, with a round cross-section. Due to pure geometric reasons a strand extending in the belt experiences under loading when running around a drive pulley a substantially lesser degree of bending elongation than a strand in a correspondingly designed cable with the same loading. A further feature of belts reinforced with strands by comparison with a cable formed from strands results from the internal construction of the belt or cable. Whereas the strands in the belt extend in isolation from one another in a belt casing and accordingly do not contact one another, strands in a cable are usually twisted in such a manner that a plurality of adjacent strands contact one another. Under loading of the cable, jamming can occur particularly at contact points of adjacent strands, which is connected with a particularly high bending elongation of the strands at the contact points. Corresponding instances of jamming do not arise for strands, which are arranged in isolation from one another, in a belt under corresponding loading of the belt. By comparison with the conditions characteristic for cables, monitoring of a belt has to be appropriately sensitive and precise. A solution for monitoring of belts is not previously known.

A belt 13 according to the present invention for use in an elevator installation is shown in FIGS. 2A to 2C. The belt 13 comprises at least two strands 12 with synthetic fiber threads which are twisted in themselves and which are designed for acceptance of force in the longitudinal direction. The strands 12 extend parallel to one another and are arranged at a spacing X from one another. The strands 12 are embedded in a common belt casing 15. At least one of the strands 12 comprises an electrically conductive indicator thread 14 which is twisted together with the synthetic fiber threads of the strand 12 and contains fibers (filaments) of an electrically conductive material, for example of carbon, hard metals such as tungsten carbide, boron or electrically conductive plastics. The indicator thread 14 is arranged outside the center of the strand 12, as is seen in FIG. 2C. So that it can be ensured that the indicator thread 14 breaks or exhibits fatigue phenomena earlier than the synthetic fiber threads of the strand 12, the breaking elongation ($\epsilon_{ult,Ind}$) of the indicator thread 14 has to be less than the breaking elongation ($\epsilon_{ult,Trag}$) of the individual synthetic fiber threads of the strand 12. The breaking elongation $\epsilon_{ult,Ind}$ and the breaking elongation $\epsilon_{ult,Trag}$ are material magnitudes. Moreover, the indicator thread 14 has to be electrically contactable in order to enable electrical monitoring of the integrity of the indicator thread 14.

There are further conditions which have to be observed in order to enable reliable monitoring of the belt 13.

Figure 3A:
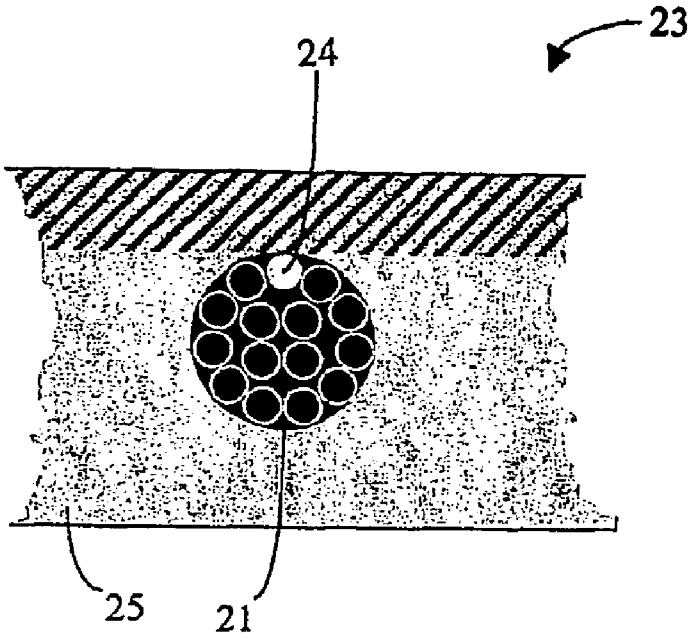
FIG. 3A is an enlarged detail of a cross-sectional view of an alternate embodiment support belt according to the present invention.

It is important that the position of an indicator thread 24 within a strand 21 is selected so that the filaments of the indicator thread 24 fatigue or break earlier than a synthetic fiber thread of the strand 21. In the extreme case the indicator thread 24 lies at the outer circumference of the strand 21 and, in particular, exactly on the side of the belt 23 which is exposed to the greatest bending load, as shown in FIG. 3A by way of hatching. It is thus ensured that the indicator thread 24 always experiences a bending load which is at least just as great as the greatest bending load of a synthetic fiber thread of the strand 21. The synthetic fiber threads are schematically indicated in FIG. 3A as circles with white circumference. In the case of an arrangement according to FIG. 3A it is sufficient to predetermine the breaking elongation $\epsilon_{ult,Ind}$ of the indicator thread 24 to be smaller than the breaking elongation $\epsilon_{ult,Trag}$ of the individual synthetic fiber threads of the strand 21. The strands 21 are embedded in a belt casing 25.

Figure 3B:
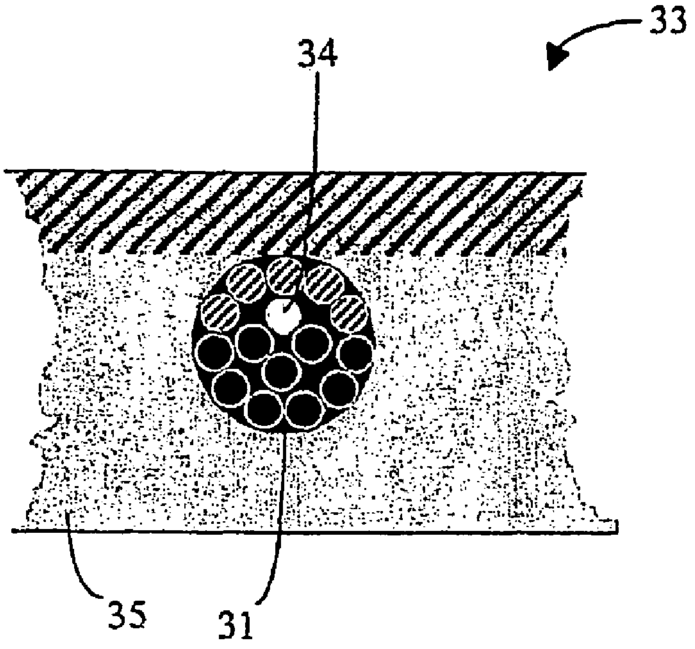
FIG. 3B is an enlarged detail of a cross-sectional view of a further embodiment support belt according to the present invention.

A further belt 33 according to the present invention is shown in FIG. 3B. There an indicator thread 34 lies in the interior of a strand 31 on a side, as seen from the strand center, which lies in the direction of the side of the belt 33 exposed to the greatest bending load as shown in FIG. 3B by way of the hatching. In such an arrangement the five hatched synthetic fiber strands experience a bending load which is greater than or the same size as the bending load which the indicator thread 24 experiences. The strands 31 are embedded in a belt casing 35. So that it is ensured in the case of such an arrangement that the indicator thread 34 exhibits fatigue phenomena or breaks before one of the synthetic fiber threads of the strand 31 fatigues or breaks the following conditions should be fulfilled: the breaking elongation $\epsilon_{ult,Ind}$ of the indicator thread 34 must be smaller by a factor "A" than the breaking elongation $\epsilon_{ult,Trag}$ of the individual synthetic fiber threads of the strand 31, wherein the factor "A" depends inter alia on the position of the indicator thread 34 within the strand 31. The following condition typically applies for A: 0.2<A<0.9 and preferably 0.3<A<0.85.

Such arrangements are, however, costly in production, since it has to be ensured that the strands are so embedded in the belt casing that the indicator thread is always directed to the "top" (position between 9 hours and 15 hours) and extends rectilinearly parallel to the longitudinal direction of the belt. However, tests have shown that this cannot be realized with manageable cost because, inter alia, the individual synthetic fiber threads of the strands are twisted in order to impart to the belt the desired longitudinal load-carrying capability.

According to the present invention the following conditions can be formulated, which have to be fulfilled in order to enable reliable monitoring of the belt:

1. The material of the indicator threads and the material of the synthetic fiber threads of the strands must be selected so that the breaking elongation $\epsilon_{ult,Ind}$ of the indicator threads is smaller than the breaking elongation $\epsilon_{ult,Trag}$ of the individual synthetic fiber threads of the strand;

2. For reasons connected with production engineering the indicator thread has to be twisted together with the synthetic fiber threads of the strand; thus, the indicator thread forms an intimate connection with the surrounding synthetic fiber threads and constantly experiences a bending load which is comparable with the bending load of the surrounding synthetic fiber strands. The indicator thread thus extends helically along the longitudinal direction of the belt. If the indicator thread does not lie at the outer circumference of the fiber bundle then the following additional condition applies:

3. The further the indicator thread lies in the interior of the strand the smaller the breaking elongation $\epsilon_{ult,Ind}$ of the indicator thread has to be.

Optimizing considerations and simulations have shown that the following condition (inequality) is preferably to be fulfilled in order to be able to guarantee reliable monitoring with consideration of the breaking elongations of the belt or of the threads:

$$\frac{\varepsilon_{eff.\ Trag} * \varepsilon_{ult,Ind}}{\varepsilon_{eff.\ Ind} * \varepsilon_{ult,Trag}} \leq 0.88$$

wherein for the elongation at the indicator thread radius $R_{Ind}$ (measured from the center point of the strand as defined in FIG. 2C) there applies:

$$\varepsilon_{eff.\ Ind} = \frac{2R_{Ind}}{D+d}$$

wherein for the elongation at the maximum synthetic fiber thread radius $R_{Trag}$ (measured from the center point of the strand as defined in FIG. 2C) there applies:

$$\varepsilon_{eff.\ Trag} = \frac{2R_{Trag}}{D+d}$$

wherein $\epsilon_{ult,Ind}$: breaking elongation of the indicator thread or the fibers of the indicator thread $\epsilon_{ult,Trag}$: breaking elongation of the synthetic fiber thread or of the synthetic fibers D: drive pulley diameter d: belt thickness (if the strand lies at half the belt thickness)

$R_{Ind}$: radial spacing of the indicator thread measured from the centre point of the strand (see FIG. 2C)

$R_{Trag}$: radial spacing of the outermost synthetic fiber thread measured from the centre point of the strand (see FIG. 2C).

According to the above inequality it can be determined how the breaking elongation $\epsilon_{ult,Ind}$ for the indicator thread has to be selected in dependence on the position (characterised by $R_{Ind}$) of the indicated thread in the interior of the strand so that the filaments of the indicator thread in the case of loading of the belt break earlier than the synthetic fiber threads, which surround the indicator thread, of the corresponding strand. The factor 0.88 used in the inequality is an empirical value which is so determined that the behaviour of the indicator thread permits, with sufficient certainty, conclusions with respect to the breakage behaviour of the synthetic fiber threads. However, the above inequality has validity only when the indicator thread is not disposed in the center of the strand and consequently the effect of the bending elongations is dominant for the breakage behaviour of the indicator thread. If the indicator thread is arranged in the center or in the vicinity of the center of the strand the breakage behaviour of the indicator thread is determined less by the bending elongations of the belt than by the tensile load. In the latter case there are present, for the indicator thread in the case of loading of the belt, conditions which correspond with the loading of a thread in a straight belt loaded only by tension or in a straight cable loaded only by tension. In this boundary case a sufficient sensitivity of the indicator thread is given when the inequality $$\frac{\varepsilon_{ult,Ind}}{\varepsilon_{ult,Trag}} \leq 0.88$$

is fulfilled. The boundary value 0.88 is empirically determined so as to enable reliable conclusions with respect to damage of the synthetic fiber threads.

According to the invention synthetic fiber threads of aramide, for example, can be used. Aramide possesses a high reverse bending fatigue strength and a high specific breaking elongation $\epsilon_{ult,Trag}$. The strands of the belt can have opposite directions of rotation.

Carbon fibers, for example, have proved themselves to be particularly suitable as filaments for the indicator thread, since they are more brittle (i.e. small breaking elongation $\epsilon_{ult,Ind}$) than aramide and since they are electrically conductive and in addition can be produced economically.

The belt casing comprises a synthetic material. The following synthetic materials are particularly suitable as belt casing: rubber, neoprene-rubber, polyurethane, polyolefine, polyvinylchloride or polyamide. According to the present invention the belt casing can have a dumb-bell-shaped, cylindrical, oval, concave, rectangular or wedge-shaped cross-sectional form.

Figure 4:
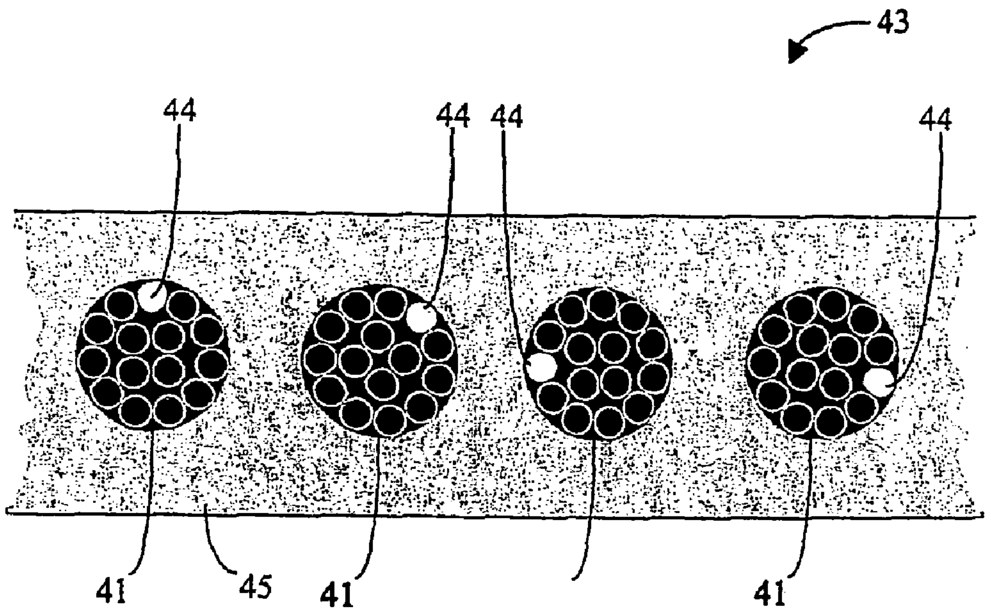
FIG. 4 is an enlarged detail of a cross-sectional view of another embodiment support belt according to the present invention.

A further form of embodiment of the present invention is shown in FIG. 4 as a schematic cross-section. The belt 43 comprises, in total, four parallelly extending strands 41.

Each strand 41 comprises several synthetic fiber threads and a respective indicator thread 44, which are twisted together. The indicator threads 44 extend in each strand 41 helically along the longitudinal direction of the belt 43. In the illustrated example the indicator threads 44 considered from left to right lie approximately at 12 hours, 1 hour, 9 hours and 4 hours. If the same belt 43 were cut at a different position, then a different picture concerning the position of the indicator threads 44 would result.

The present invention can be used with all belts having synthetic fiber strands for reinforcement. Examples are: flat belts, poly-V-belts, V-ribbed belts 53 (as shown, for example, in FIG. 5) or (trapezium) cogged belts 63 (as shown, for example, in FIG. 6).

Figure 5:
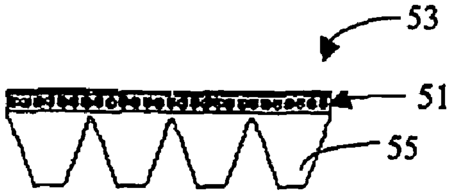
FIG. 5 is a fragmentary cross-sectional view of a V-ribbed belt according to the present invention.

The V-ribbed belt 53 according to the present invention, as shown in FIG. 5, has an integral number of parallelly extending strands 51 which are embedded in a belt casing 55.

Figure 6:
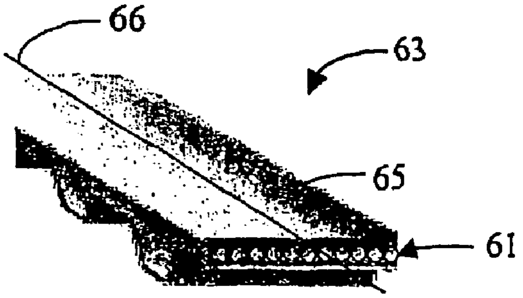
FIG. 6 is a perspective view of a cogged belt according to the present invention.

The trapezium cogged belt 63 according to the present invention, as shown in FIG. 6, has an integral number of parallelly extending strands 61 which are embedded in a belt casing 65.

According to the present invention a synthetic fiber strand can have several indicator threads. In a further form of embodiment the belt has several parallel strands. A first strand comprises a first indicator thread which has a first breaking elongation $\epsilon_{ult,Ind1}$. A second strand comprises a second indicator thread which has a second breaking elongation $\epsilon_{ult,Ind2}$. If the following condition $\epsilon_{ult,Ind2}>\epsilon_{ult,Ind1}$ now applies, then the first carbon fiber responds initially, since this first carbon fiber is more sensitive. Depending on the elevator installation, a predetermined reaction can be initiated in this case. For example, a service call can be placed or the elevator operation can be restricted. If the second carbon fiber fails, then, for example, the elevator operation can be stopped entirely.

In addition, several strands can each contain an indicator thread with the same breaking elongation $\epsilon_{ult,Ind}$ and the increase in the number of failed strands serves as a trigger criterion for a suitable reaction.

According to the present invention an indicator circuit can be used which ascertains by measurement whether the properties of a carbon fiber have changed or whether a carbon fiber was interrupted. In that case, for example, the carbon fibers of two fiber bundles can be conductively connected together at one end of the belt. At the other end of the belt, for example, a resistance measurement can then be undertaken in order to make changes recognizable. The indicator circuit can comprise, for example, one or more comparators and one or more analog-to-digital converters which produce a connection to the elevator control, which is usually of digital construction.

The present invention enables for the first time a reliable and timely recognition of fatigues and breakages of fiber bundles which impart the load-bearing strength to a belt. A belt of that kind can be exchanged in good time.

In accordance with the provisions of the patent statutes, the present invention has been described in what is considered to represent its preferred embodiment. However, it should be noted that the invention can be practiced otherwise than as specifically illustrated and described without departing from its spirit or scope.

What is claimed is:

1. A belt with at least two strands which comprise synthetic fiber threads twisted in themselves and which are designed for acceptance of force in a longitudinal direction, wherein the strands are arranged parallel to one another along a longitudinal direction of the belt and at a spacing from one another and are embedded in a belt casing, comprising:

at least one of the strands including an electrically conductive indicator thread which is twisted together with the synthetic fiber threads of the at least one strand; and wherein said indicator thread has a breaking elongation ($\epsilon_{ult,Ind}$) which is smaller than a breaking elongation ($\epsilon_{ult,Trag}$) of individual ones of the synthetic fiber threads of the strand and is adapted to be electrically contacted so as to enable an electrical monitoring of the integrity of the indicator thread, and wherein a boundary value of said at least one strand is less than or equal to 0.88.

2. The belt according to claim 1 wherein said indicator thread is more brittle and less resilient than the synthetic fiber threads of the strand.

3. The belt according to claim 1 wherein a maximum effective elongation of said indicator thread under load is less than the breaking elongation ($\epsilon_{ult,Trag}$) of the individual synthetic fiber threads of the strand.

4. The belt according to claim 1 wherein the belt is adapted for running at least partly around a pulley which has a radius less than 100 mm.

5. The belt according to claim 1 wherein the belt is adapted for running at least partly around a pulley which has a radius less than 50 mm.

6. The belt according to claim 1 wherein said indicator thread is adapted to be electrically contacted by contact means that can be fastened to one or both ends of the belt.

7. The belt according to claim 1 being one of a flat belt, a poly-V-belt, a V-fibbed belt and a cogged belt.

8. The belt according to claim 1 being adapted for use in an elevator installation as a support means or a drive means.

9. The belt according to claim 1 wherein said indicator thread is arranged outside a center of the at least one strand.

10. A belt and pulley for an elevator installation, comprising:

an elevator pulley;

a belt running at least partly around said pulley with at least two strands which comprise synthetic fiber threads twisted in themselves and which are designed for acceptance of force in a longitudinal direction, wherein said strands are arranged parallel to one another along a longitudinal direction of said belt and at a spacing from one another and are embedded in a belt casing;

at least one of said strands including an electrically conductive indicator tbread which is twisted together with said synthetic fiber threads of said at least one strand; and wherein said indicator thread has a breaking elongation ($\epsilon_{ult,Ind}$) which is smaller than a breaking elongation ($\epsilon_{ult,Trag}$) of individual ones of said synthetic fiber threads of said strand and is adapted to be electrically contacted so as to enable an electrical monitoring of an integrity of said indicator thread, and wherein a boundary value of the said at least one strand is less than or equal to 0.88.

11. The belt and pulley according to claim 10 wherein said indicator thread is more brittle and less resilient than said synthetic fiber threads of said strand.

12. The belt and pulley according to claim 10 wherein a maximum effective elongation of said indicator thread under load is less than the breaking elongation ($\epsilon_{ult,Trag}$) of said individual synthetic fiber threads of said strand.

13. The belt and pulley according to claim 10 wherein said pulley has a radius less than 100 mm.

14. The belt and pulley according to claim 10 wherein said pulley has a radius less tan 50 mm.

15. The belt and pulley according to claim 10 wherein said indicator thread is adapted to be electrically contacted by contact means that can be fastened to one or both ends of said belt.

16. The belt and pulley according to claim 10 wherein said belt is one of a flat belt, a poly-V-belt, a V-ribbed belt and a cogged belt.

17. The belt and pulley according to claim 10 being adapted for use in an elevator installation as a support means or a drive means.

18. The belt and pulley according to claim 10 wherein said indicator thread is arranged outside a center of said at least one strand.

19. The belt and pulley according to claim 10 wherein said indicator thread is formed of an electrically conductive material selected from one of carbon, tungsten carbide, boron and plastic.

20. A belt with at least two strands which comprise synthetic fiber threads twisted in themselves and which are designed for acceptance of force in a longitudinal direction, wherein the strands are arranged parallel to one another along a longitudinal direction of the belt and at a spacing from one another and are embedded in a belt casing, comprising:

at least one of the stands including an indicator thread which is twisted together with the synthetic fiber threads of the at least one strand, said indicator thread being formed of an electrically conductive material selected from one of carbon, tungsten carbide, boron and plastic; and wherein said indicator thread has a breaking elongation ($\epsilon_{ult,Ind}$) which is smaller than a breaking elongation ($\epsilon_{ult,Trag}$) of individual ones of the synthetic fiber threads of the strand and is adapted to be electrically contacted so as to enable an electrical monitoring of the integrity of the indicator thread.

* * * * *